United States Patent
Shih et al.

(10) Patent No.: US 10,431,700 B2
(45) Date of Patent: Oct. 1, 2019

(54) CONDUCTIVE PASTE COMPOSITION FOR PROVIDING ENHANCED ADHESION STRENGTH TO A SEMICONDUCTOR SUBSTRATE AND ITS USE

(71) Applicant: GIGA SOLAR MATERIALS CORP., Hsinchu County (TW)

(72) Inventors: Po-Yang Shih, Hsinchu County (TW); Yu-Shuo Yang, Hsinchu County (TW); Pi-Yu Hsin, Hsinchu County (TW)

(73) Assignee: Giga Solar Materials Corp., Hsinchu County (TW)

( * ) Notice: Subject to any disclaimer, the term of this patent is extended or adjusted under 35 U.S.C. 154(b) by 0 days.

(21) Appl. No.: 15/920,940

(22) Filed: Mar. 14, 2018

(65) Prior Publication Data
US 2018/0358486 A1 Dec. 13, 2018

Related U.S. Application Data

(60) Provisional application No. 62/517,371, filed on Jun. 9, 2017.

(51) Int. Cl.
| | |
|---|---|
| H01L 31/0224 | (2006.01) |
| H01B 1/22 | (2006.01) |
| H01L 31/0216 | (2014.01) |
| C09D 5/24 | (2006.01) |
| C09D 101/28 | (2006.01) |
| C09D 7/61 | (2018.01) |
| C09D 5/00 | (2006.01) |
| C08K 3/22 | (2006.01) |
| C08K 3/08 | (2006.01) |
| C08K 3/40 | (2006.01) |

(52) U.S. Cl.
CPC ...... H01L 31/022425 (2013.01); C09D 5/006 (2013.01); C09D 5/24 (2013.01); C09D 7/61 (2018.01); C09D 101/28 (2013.01); H01B 1/22 (2013.01); H01L 31/02168 (2013.01); C08K 3/08 (2013.01); C08K 3/22 (2013.01); C08K 3/40 (2013.01); C08K 2003/0806 (2013.01); C08K 2003/2203 (2013.01); C08K 2003/2227 (2013.01); C08K 2201/001 (2013.01)

(58) Field of Classification Search
CPC ...... H01L 31/022425; H01L 31/02168; C09D 7/61; C09D 5/24; H01B 1/22
See application file for complete search history.

(56) References Cited

U.S. PATENT DOCUMENTS 5,089,172 A * 2/1992 Allison ............... C03C 3/066
   252/512
6,146,483 A * 11/2000 Hanoka ............... B41M 3/12
   156/182

OTHER PUBLICATIONS

English translation of Sang-Young Lee, KR101799889 (B1).*

* cited by examiner

*Primary Examiner* — Niki Bakhtiari
(74) *Attorney, Agent, or Firm* — Rosenberg, Klein & Lee

(57) ABSTRACT

The present invention relates to a conductive paste, which imparts an electrode formed therefrom with enhanced adhesion strength to a semiconductor substrate by incorporation of $LiAlO_2$ (lithium aluminate) therein. The present invention further relates to an electrode formed from the conductive paste and a semiconductor and in particular, a solar cell comprising the electrode produced therefrom.

11 Claims, No Drawings

CONDUCTIVE PASTE COMPOSITION FOR PROVIDING ENHANCED ADHESION STRENGTH TO A SEMICONDUCTOR SUBSTRATE AND ITS USE

CROSS-REFERENCE TO RELATED APPLICATIONS

The present application claims priority to U.S. Provisional Patent Application No. 62/517,371 filed on Jun. 9, 2017.

BACKGROUND OF THE INVENTION

Field of the Invention

The present invention relates to a conductive paste composition, which imparts an electrode formed therefrom with enhanced adhesion strength to a semiconductor substrate by incorporation of $LiAlO_2$ (lithium aluminate) therein. The present invention further relates to an electrode formed from the conductive paste and a solar cell comprising the electrode produced therefrom.

Description of Related Art

A solar cell is an electrical device that converts the energy of light directly into electricity by the photovoltaic effect. Most solar cells are in the form of a silicon wafer that has been metalized, i.e., provided with metal electrodes that are electrically conductive. Typically, conductive pastes are screen printed onto substrates and fired to form the electrodes, such as front and rear electrodes. During firing, the boundary between the back side aluminum and the back side silver or silver/aluminum assumes the state of an alloy, thereby achieving electrical connection. In addition, the front side silver paste sinters and penetrates through an anti-reflective layer (e.g., $SiN_x$ film) during firing and thereby achieves electrical contact with a semiconductor substrate.

Conventional conductive pastes for forming an electrode comprise a conductive metal, a glass frit and an organic medium. However, insufficient adhesion strength of an electrode produced from conductive pastes to a substrate would result in inferior performance of the resultant solar cells. Hence, there is a need to provide conductive pastes that can impart the produced electrode with enhanced adhesion strength to a substrate, a comparable or better photovoltaic conversion efficiency and a comparable or higher fill factor.

BRIEF SUMMARY OF THE INVENTION

The present inventors found that by incorporation of $LiAlO_2$ into conductive pastes can provide enhanced adhesion strength of an electrode prepared therefrom to a substrate. Accordingly, the present invention provides a conductive paste composition comprising:
 (a) a conductive metal, its derivative or a combination thereof;
 (b) a glass frit;
 (c) $LiAlO_2$; and
 (d) an organic medium.

In another aspect, the present invention provides an electrode produced from the above conductive paste, and solar cells containing the electrode.

DETAILED DESCRIPTION OF THE INVENTION

Component (a): Conductive Metal

The conductive metal of the present invention is not subject to any special limitation as long as it can achieve the technical effect of the present invention. The conductive metal can be one single element selected from the group consisting of silver, aluminum and copper; and also can be alloys or mixtures of the above metal with other metals, such as gold, platinum, palladium, nickel and the like. From the viewpoint of conductivity, pure silver is preferable.

In the case of using silver as the conductive metal, it can be in the form of silver metal, silver derivatives and/or the mixture thereof. Examples of silver derivatives include silver oxide ($Ag_2O$), silver salts (such as silver chloride (AgCl), silver nitrate ($AgNO_3$), silver acetate ($AgOOCCH_3$), silver trifluoroacetate ($AgOOCCF_3$) or silver phosphate ($Ag_3PO_4$), silver-coated composites having a silver layer coated on the surface or silver-based alloys or the like.

In one embodiment, the conductive metal can be in the form of powder (for example, spherical shape, flakes, irregular form and/or the mixture thereof) or colloidal suspension or the like. The average particle size of the conductive metal is not subject to any particular limitation, while 0.05 to 10 microns is preferable. Mixtures of conductive metals having different average particle sizes, particle size distributions or shapes, and etc. also can be employed.

In one embodiment of the present invention, the conductive metal includes silver powder.

The amount of the conductive metal, its derivative or the combination thereof used in the present invention is not subject to any special limitation as long as it can achieve the technical effect of the present invention.

In one embodiment of the present invention, the conductive paste composition contains about 65 wt. % to about 95 wt. % of a conductive metal, its derivative or the combination thereof, based on the total weight of the conductive paste composition.

In one embodiment of the present invention, the conductive paste composition contains about 70 wt. % to about 85 wt. % of a conductive metal, its derivative or the combination thereof, based on the total weight of the conductive paste composition.

Component (b): Glass Frit

The glass frit of the present invention is not subject to any special limitation as long as it can achieve the technical effect of the present invention.

The glass frit may be lead-containing or lead-free. Examples of the glass frit include, but are not limited to lead oxide, tellurium oxide, bismuth oxide, silicon oxide, tungsten oxide, magnesium oxide, etc.

In one embodiment, the glass frit may include Pb—Te-oxide, Pb—Te—Bi-oxide, Pb—Te—Bi—Si-oxide, Pb—Te—Bi—Mg-oxide, Pb—Te—Bi—W-oxide, Te—Bi-oxide, Te—Bi—W-oxide and the combinations thereof.

In one embodiment of the present invention, the glass frit further comprises one or more elements or the oxide thereof selected from the group consisting of phosphorus (P), barium (Ba), sodium (Na), zinc (Zn), calcium (Ca), strontium (Sr), aluminum (Al), lithium (Li), potassium (K), zirconium (Zr), vanadium (V), selenium (Se), iron (Fe), indium (In), manganese (Mn), tin (Sn), nickel (Ni), antimony (Sb), silver (Ag), boron (B), copper (Cu), thallium (Tl), erbium (Er), germanium (Ge), titanium (Ti), gallium (Ga), cerium (Ce), niobium (Nb), samarium (Sm) and lanthanum (La) or the oxide thereof in an amount of about 0.1 wt. % to about 10 wt. %, based on the weight of the glass frit.

In one embodiment of the present invention, the conductive paste composition contains about 0.1 wt. % to about 10 wt. % of a glass frit, based on the total weight of the conductive paste composition. In another embodiment of the present invention, the conductive paste composition contains about 0.5 wt. % to about 6 wt. % of a glass frit, based on the total weight of the conductive paste composition.

Component (c): $LiAlO_2$

In one embodiment, the conductive paste composition contains about 0.1 wt. % to about 5 wt. % $LiAlO_2$, based on the total weight of the conductive paste composition. In another embodiment, the conductive paste composition contains about 0.2 wt. % to about 3 wt. % $LiAlO_2$, based on the total weight of the conductive paste composition.

Component (d): Organic Medium

Suitable organic media can uniformly disperse all the components of the conductive paste composition therein and have a proper viscosity to deliver said components to the surface of the antireflective coating by screen printing, stencil printing or the like.

In one embodiment, the organic medium is a solvent which is not subject to particular limitation and can be properly selected from conventional solvents for conductive pastes. Examples of solvents include alcohols (e.g., isopropyl alcohol), esters (e.g., propionate, dibutyl phthalate) and ethers (e.g., butyl carbitol) or the like or the mixture thereof. Preferably, the solvent is an ether having a boiling point of about 120° C. to about 300° C. Most preferably, the solvent is butyl carbitol. The organic medium can further comprise volatile liquids to promote the rapid hardening after application of the conductive paste onto the semiconductor substrate.

In another embodiment, the organic medium is a solution comprising a polymer and a solvent. Examples of polymers include cellulose (e.g., ethyl cellulose), nitrocellulose, ethyl hydroxyethylcellulose, carboxymethylcellulose, hydroxypropylcellulose or other cellulose derivatives), poly(meth) acrylate resins of lower alcohols, phenolic resins (e.g., phenol resin), alkyd resins (e.g., ethylene glycol monoacetate) or the like or the mixtures thereof. Preferably, the polymer is cellulose. Most preferably, the polymer is ethyl cellulose.

In one further embodiment, the organic medium comprises ethyl cellulose dissolved in ethylene glycol butyl ether.

In another embodiment, the organic medium further comprises one or more functional additives. Examples of functional additives include viscosity modifiers, dispersing agents, thixotropic agents, wetting agents and/or optionally other conventional additives (for example, colorants, preservatives or oxidants), and etc. Functional additives are not subject to particular limitation as long as they do not adversely affect the technical effect of the present invention.

The optimal amount of organic media in the conductive paste composition is dependent on the method of applying the paste composition and the specific organic medium used. In one further embodiment, the conductive paste composition contains about 7 wt. % to about 30 wt. % of an organic medium, based on the total weight of the conductive paste composition.

Manufacture and Application of Conductive Paste Composition

In the present invention, the conductive paste composition can be prepared by mixing and dispersing a conductive metal, a glass frit, $LiAlO_2$ and an organic medium (i.e., components (a)-(d)) in a three-roll mill. The conductive paste composition preferably has good drying rate and excellent fire-through properties.

Another aspect of the present invention is to provide an article comprising a semiconductor substrate and an abovementioned conductive paste composition applied on the semiconductor substrate. In one embodiment, the article is a semiconductor device. In another embodiment, the semiconductor device is a solar cell.

The conductive paste composition of the present invention can be first printed on the antireflective coating as grid lines or other patterns wherein the printing step could be carried out by conventional methods, such as screen printing or stencil printing, and etc. Then, the fire-through step is carried out at an oxygen-containing atmosphere (such as ambient air) by setting a temperature of about 800° C. to about 980° C. for about 0.05 to about 5 minutes to remove the organic medium and fire the conductive metal, whereby the conductive paste after-firing is free of any organic substances substantially and the conductive paste after-firing penetrates through the antireflective coating to form contact with the semiconductor substrate and one or more antireflective coating(s) beneath. This fire-though step forms the electrical contact between the semiconductor substrate and the grid lines (or in other patterns) through metal contacts and therefore front electrodes are formed.

In one embodiment, the proportions of the components (a), (b), (c) and (d) are dependent on the viscosity of the conductive paste composition, thereby allows the conductive paste composition to have sufficient adhesion strength to the substrate after firing.

Another aspect of the present invention relates to an article, preferably for the manufacture of a semiconductor device, more preferably for the manufacture of a solar cell. In one example of the present invention, a semiconductor substrate is provided, wherein said semiconductor substrate includes substrates suitable for a semiconductor integrated chip, a glass substrate suitable for forming a solar cell or other the like. One or more antireflective coating(s) can be applied onto the semiconductor substrate by conventional methods, such as chemical vapor deposition, plasma enhanced vapor deposition, and etc. The conductive paste composition of the present invention is applied on the semiconductor substrate with antireflective coating(s). Subsequently, the abovementioned fire-through steps are performed to obtain the articles.

In one embodiment, the semiconductor substrate comprises amorphous, polycrystalline or monocrystalline silicon, or the polycrystalline PERC, monocrystalline PERC silicon. In another preferred example of the present invention, the antireflective coating comprises silicon dioxide, titanium dioxide, silicon nitride or other conventional coatings.

The foregoing has outlined the technical features and the technical effects of the present invention. It should be appreciated by a person of ordinary skill in the art that the specific embodiments disclosed may be easily combined, modified, replaced and/or conversed for other articles, processes or usages within the spirit of the present invention. Such equivalent scope does not depart from the protection scope of the present invention as set forth in the appended claims.

Without intending to limit the present invention, the present invention is illustrated by means of the following examples.

EXAMPLES

Preparation of Conductive Pastes

Glass A, B, C and D Used in Preparation of Conductive Pastes were Listed in Table 1.

TABLE 1

Compositions of Glass A, B, C and D

| Glass | |
|---|---|
| A | Pb—Te—Bi—Si-oxide |
| B | Pb—Te—Bi—W-oxide |
| C | Te—Bi—W-oxide |
| D | Pb—Te—Bi—Mg-oxide |

COMPARATIVE EXAMPLES

Comparative Examples 1-5

An organic medium for conductive pastes was prepared by dissolving 5 to 25 grams of ethyl cellulose in 5 to 75 grams of ethylene glycol butyl ether and adding a small amount of a viscosity modifier, a dispersing agent, a thixotropic agent, a wetting agent therein. Then, a conductive paste was prepared by mixing and dispersing 80 to 99.5 grams of industrial grade silver powder, 2.5 grams of Glass A and 10 to 30 grams of an organic medium in a three-roll mill.

Comparative Example 6

A conductive paste was prepared in a manner described in Comparative Examples 1-5, except that 2.5 grams of Glass B was added to replace Glass A.

Comparative Example 7

A conductive paste was prepared in a manner described in Comparative Examples 1-5, except that 2.3 grams of Glass C was added to replace Glass A.

Comparative Example 8

A conductive paste was prepared in a manner described in Comparative Examples 1-5, except that 2.25 grams of Glass D was added to replace Glass A.

EXAMPLES OF THE INVENTION

Examples 1, 4 and 7

A conductive paste was prepared in a manner described in Comparative Examples 1-5, except that 2 wt. % of $LiAlO_2$ was added therein, based on the total weight of the conductive paste.

Examples 2, 5 and 8

A conductive paste was prepared in a manner described in Comparative Examples 1-5, except that 1 wt. % of $LiAlO_2$ was added therein, based on the total weight of the conductive paste.

Examples 3, 6 and 9

A conductive paste was prepared in a manner described in Comparative Examples 1-5, except that 0.2 wt. % of $LiAlO_2$ was added therein, based on the total weight of the conductive paste.

Example 10

A conductive paste was prepared in a manner described in Comparative Example 1-5, except that 2.25 wt. % of Glass A instead of 2.5 wt. % was added and 0.65 wt. % of $LiAlO_2$ was added therein, based on the total weight of the conductive paste.

Example 11

A conductive paste was prepared in a manner described in Comparative Example 1-5, except that 0.65 wt. % of $LiAlO_2$ was added therein, based on the total weight of the conductive paste.

Example 12

A conductive paste was prepared in a manner described in Comparative Example 6, except that 0.7 wt. % of $LiAlO_2$ was added therein, based on the total weight of the conductive paste.

Example 13

A conductive paste was prepared in a manner described in Comparative Example 6, except that 0.6 wt. % of $LiAlO_2$ was added therein, based on the total weight of the conductive paste.

Example 14

A conductive paste was prepared in a manner described in Comparative Example 7, except that 0.3 wt. % of $LiAlO_2$ was added therein, based on the total weight of the conductive paste.

Example 15

A conductive paste was prepared in a manner described in Comparative Example 8, except that 0.6 wt. % of $LiAlO_2$ was added therein, based on the total weight of the conductive paste.

Preparation of Test Electrodes

In order to determine the adhesion properties of electrodes formed from the conductive paste of Comparative Example 1-8 and Examples 1-15 and the resultant solar cell performance, the conductive paste was screen printed onto a monocrystalline silicon substrate, polycrystalline silicon substrate or monocrystalline PERC silicon substrate and then was dried at a temperature of about 100° C. to about 250° C. for about 5 to about 30 minutes. The dried conductive pastes were further fired at a setting temperature of 810° C. to 910° C. by means of an IR conveyer type furnace.

Soldering/Adhesion Strength Test

A solder ribbon was cut into a suitable length by a cutting machine and then was applied with s soldering flux (Model: ANX3012, Asahi) to remove the oxide layer on solder ribbons. Subsequently, the solder ribbon was soldered at a given temperature for a given time. Solder can be carried out by non-contact heating (e.g., IR series soldering or hot-air series soldering, etc.) or contact heating (e.g., series soldering by means of soldering iron, etc.).

IR series soldering was adopted in the experiment. Solder temperature was 230° C. and solder time was set at 2 sec. The solder ribbon has the specification as described in Table 2 below:

TABLE 2

Specification of the Solder Ribbon

| | |
|---|---|
| Copper Core | 0.25 mm × 1.6 mm |
| Coating | Sn = 60%; Pb = 40% |
| Thickness of the Coating | 20 ± 5 μm |

Adhesion strength test was carried by placing a test electrode on an adhesion strength testing machine (Model: MOGRL009, MOGRL Technology, Co., Ltd.), fixing one end of the solder ribbon with a fixture and pulling the solder ribbon at an angle of 180° and a speed of 300 mm/min. The adhesion value was obtained by the accompanied electronic force gauge.

Solar Cell Performance Test

The resultant solar cell was subjected to measurements of electrical characteristics using a solar performance testing device (Berger, Pulsed Solar Load PSL-SCD) under AM 1.5G solar light to determine the fill factor (FF, unit: %) and photovoltatic conversion efficiency (Ncell, unit: %), etc.

Test Results

Part A.

Conductive pastes of Examples 1-9 and conductive pastes of Comparative Examples 1-3 were screen printed onto a monocrystalline silicon substrate. The adhesion strength test results is shown in Table 3.

TABLE 3

Adhesion Strength Test Results: Examples 1-9 and Comparative Examples 1-3

| Conductive Paste | LiAlO$_2$ (wt. %) | Glass A (wt. %) | Adhesion (N/mm) | Temperature set for firing (° C.) |
|---|---|---|---|---|
| Example 1 | 2 | 2.5 | 2.490 | 870 |
| Example 2 | 1 | 2.5 | 2.275 | |
| Example 3 | 0.2 | 2.5 | 2.012 | |
| Comparative Example 1 | 0 | 2.5 | 1.474 | |
| Example 4 | 2 | 2.5 | 2.017 | 890 |
| Example 5 | 1 | 2.5 | 1.923 | |
| Example 6 | 0.2 | 2.5 | 1.835 | |
| Comparative Example 2 | 0 | 2.5 | 1.527 | |
| Example 7 | 2 | 2.5 | 2.103 | 910 |
| Example 8 | 1 | 2.5 | 1.646 | |
| Example 9 | 0.2 | 2.5 | 1.560 | |
| Comparative Example 3 | 0 | 2.5 | 1.460 | |

Table 3 shows that the addition of LiAlO$_2$ significantly increases the adhesion strength of an electrode prepared from the conductive paste of the present invention to the monocrystalline silicon substrate.

Conductive pastes of Example 10, Example 11, Comparative Example 4 and Comparative Example 5 were screen printed onto a monocrystalline PERC substrate. The adhesion strength of the resultant electrodes to the substrate and the electrical characteristics of the solar cells containing said electrodes are shown in Table 4.

TABLE 4

Test Results of Adhesion Strength and Electrical Characteristics: Examples 10, 11 and Comparative Examples 4, 5

| Conductive Paste | LiAlO$_2$ (wt. %) | Glass A (wt. %) | Adhesion (N/mm) | Ncell (%) | FF (%) | Temperature set for firing (° C.) |
|---|---|---|---|---|---|---|
| Example 10 | 0.65 | 2.25 | 1.74 | 20.88 | 79.02 | 875 |
| Comparative Example 4 | 0 | 2.5 | 1.22 | 20.83 | 78.74 | |
| Example 11 | 0.65 | 2.5 | 2.54 | 20.69 | 78.67 | 855 |
| Comparative Example 5 | 0 | 2.5 | 1.99 | 20.74 | 78.75 | |

Table 4 demonstrates that addition of LiAlO$_2$ in the conductive paste composition can enhance the adhesion strength of an electrode prepared therefrom to a monocrystalline PERC substrate. In addition, the solar cells containing said electrodes exhibit a comparable or even better electrical characteristics (such as higher photovoltaic conversion efficiency and fill factor), as compared with the electrode prepared from the LiAlO$_2$-free conductive pastes.

Part. B

Conductive Pastes of Example 12, Example 13 and Comparative Example 6 were screen printed on monocrystalline silicon substrate and fired at 810° C. Table 5 shows the test results of the adhesion strength and the electrical characteristics of the solar cells containing said electrode prepared therefrom.

TABLE 5

Test results of the adhesion strength and electrical characteristics of the resultant electrode: Examples 12, 13 and Comparative Example 6

| Conductive Paste | LiAlO$_2$ (wt. %) | Glass B (wt. %) | Adhesion (N/mm) | Ncell (%) | FF (%) |
|---|---|---|---|---|---|
| Example 12 | 0.7 | 2.5 | 2.29 | 19.51% | 79.17 |
| Example 13 | 0.6 | 2.5 | 1.98 | 19.50% | 79.14 |
| Comparative Example 6 | 0 | 2.5 | 1.82 | 19.48% | 79.05 |

It is obvious from Table 5 that the conductive pastes of Examples 12 and 13 may impart the resultant electrode not only an increased adhesion strength to the monocrystalline silicon substrate, but also impart the resultant solar cells containing said electrodes with a better photovoltaic conversion efficiency and a higher FF value, as compared with LiALO$_2$-free conductive pastes of Comparative Example 6.

Part. C

Conductive Pastes of Example 14 and Comparative Example 7 were screen printed on polycrystalline silicon substrate and fired at 830° C. Table 6 shows the test results of the adhesion strength and electrical characteristics of the solar cells containing the electrode prepared therefrom.

TABLE 6

Test results of the adhesion strength and electrical characteristics of the resultant electrode: Example 14 and Comparative Example 7

| Conductive Paste | LiAlO$_2$ (wt. %) | Glass C (wt. %) | Adhesion (N/mm) | Ncell (%) | FF (%) |
|---|---|---|---|---|---|
| Example 14 | 0.3 | 2.3 | 2.20 | 18.04 | 79.09 |
| Comparative Example 7 | 0 | 2.3 | 1.45 | 18.05 | 79.22 |

From Table 6, it can be seen that the conductive paste of Example 14 may impart the resultant electrode an increased adhesion strength to the polycrystalline silicon substrate and the resultant solar cells containing said electrodes may have a comparable photovoltaic conversion efficiency and FF value, as compared with $LiAlO_2$-free conductive pastes of Comparative Example 7.

Part. D

Conductive Pastes of Example 15 and Comparative Example 8 were screen printed on monocrystalline PERC substrate and fired at 855° C. Table 7 shows the test results of the adhesion strength and electrical characteristics of the solar cells containing the electrode prepared therefrom.

TABLE 7

Test results of the adhesion strength and electrical characteristics of the resultant electrode: Example 15 and Comparative Example 8

| Conductive Paste | $LiAlO_2$ (wt. %) | Glass D (wt. %) | Adhesion (N/mm) | Ncell (%) | FF (%) |
|---|---|---|---|---|---|
| Example 15 | 0.6 | 2.25 | 2.49 | 20.62 | 78.40 |
| Comparative Example 8 | 0 | 2.25 | 2.02 | 20.64 | 78.53 |

From Table 7, it can be seen that the conductive paste of Example 15 may impart the resultant electrode an increased adhesion strength to the monocrystalline PERC substrate and the resultant solar cells exhibit a comparable photovoltatic conversion efficiency (Ncell) and FF value, as compared with $LiALO_2$-free conductive pastes of Comparative Example 8.

In summary, Tables 3-7 clearly show that the addition of $LiAlO_2$ in the conductive pastes may significantly increase the adhesion strength of the electrode prepared therefrom to a monocrystalline or polycrystalline silicon substrate or a monocrystalline PERC substrate. In addition, the solar cells containing the electrode prepared therefrom may also possess a comparable or higher photovoltaic conversion efficiency and/or FF values.

The above examples are only used to illustrate the technical features of the present invention and the technical effects thereof. The technical content of said examples can still be practiced by substantially equivalent combination, modifications, replacements and/or conversions. Accordingly, the protection scope of the present invention is based on the scope of the inventions defined by the appended claims.

What is claimed is:

1. A conductive paste composition for forming an electrode for solar cells, said conductive paste comprising:
   (a) a conductive metal, derivatives of the conductive metal or a combination thereof;
   (b) a glass frit;
   (c) $LiAlO_2$; and
   (d) an organic medium,
   said conductive paste providing increased adhesion strength of said electrode to a substrate.

2. The conductive paste composition according to claim 1, wherein the conductive paste, the derivatives of the conductive metal or a combination thereof comprise silver powder.

3. The conductive paste composition according to claim 1, which contains about 65 wt. % to about 90 wt. % of the conductive metal, its derivative or the combination thereof, based on the total weight of the conductive paste composition.

4. The conductive paste composition according to claim 1, which contains about 0.1 wt. % to about 10 wt. % of the glass frit, based on the total weight of the conductive paste composition.

5. The conductive paste composition according to claim 1, which contains about 0.1 wt. % to about 5 wt. % $LiAlO_2$, based on the total weight of the conductive paste composition.

6. The conductive paste composition according to claim 1, which contains about 8 wt. % to about 30 wt. % of an organic medium, based on the total weight of the conductive paste composition.

7. The conductive paste composition according to claim 6, wherein the organic medium is a solution comprising a polymer and a solvent.

8. The conductive paste composition according to claim 1, wherein the organic medium further comprises one or more functional additives selected from the group consisting of a viscosity modifier, a dispersing agent, a thixotropic agent and a wetting agent.

9. An article comprising a semiconductor substrate and an electrode formed from the conductive paste composition according to claim 1.

10. The article according to claim 9, which further comprises one or more antireflective coatings applied onto the semiconductor substrate; and wherein the conductive paste contacts the one or more antireflective coatings and has electrical contact with the semiconductor substrate.

11. The article according to claim 9, which is a solar cell.

* * * * *